(12) United States Patent
Matsumura et al.

(10) Patent No.: US 8,973,832 B2
(45) Date of Patent: Mar. 10, 2015

(54) RFID TAG AND RFID SYSTEM

(71) Applicant: Fujitsu Limited, Kawasaki-shi, Kanagawa (JP)

(72) Inventors: Takayoshi Matsumura, Yokohama (JP); Noritsugu Osaki, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 43 days.

(21) Appl. No.: 13/922,344

(22) Filed: Jun. 20, 2013

(65) Prior Publication Data

US 2014/0021262 A1  Jan. 23, 2014

(30) Foreign Application Priority Data

Jul. 23, 2012 (JP) ................................ 2012-162456

(51) Int. Cl.
  *G06K 19/02* (2006.01)
  *G06K 19/06* (2006.01)
  *H04Q 5/22* (2006.01)
  *G08B 13/14* (2006.01)
  *G06K 19/077* (2006.01)

(52) U.S. Cl.
  CPC ............................... *G06K 19/07749* (2013.01)
  USPC ........ 235/488; 235/492; 340/10.1; 340/572.1; 340/572.7

(58) Field of Classification Search
  CPC .................. G06K 19/07749; G06K 19/07779; G06K 19/0723; G06K 19/07728; G08B 13/2434
  USPC ........... 235/488, 492; 340/10.1, 572.1–572.8; 343/866, 867
  See application file for complete search history.

(56) References Cited

U.S. PATENT DOCUMENTS

| 2006/0244600 | A1 | 11/2006 | Baba |
| 2007/0139205 | A1 | 6/2007 | Tanaka et al. |
| 2007/0200708 | A1 | 8/2007 | Hayama et al. |
| 2007/0278315 | A1* | 12/2007 | Michalk ........................ 235/492 |
| 2010/0258640 | A1* | 10/2010 | Takeuchi et al. ............... 235/492 |
| 2012/0145794 | A1* | 6/2012 | Mieslinger .................... 235/488 |

FOREIGN PATENT DOCUMENTS

| JP | 09-269988 A | 10/1997 |
| JP | 2004-310714 A | 11/2004 |
| JP | 2006-268090 A | 10/2006 |
| JP | 2007-286213 A | 11/2007 |

OTHER PUBLICATIONS

European Search Report application No. 13171784.5 dated Jan. 27, 2014.

* cited by examiner

*Primary Examiner* — Michael G Lee
*Assistant Examiner* — Laura Gudorf
(74) *Attorney, Agent, or Firm* — Squire Patton Boggs (US) LLP

(57) ABSTRACT

An RFID tag includes: a base sheet in which a plurality of first slits are formed to extend alternately from two opposite sides from an end of the base sheet; an antenna pattern provided on the base sheet by folding the antennal pattern to avoid the first slits; an RFID chip provided over the base sheet and electrically connected to the antenna pattern; an elastic sheet provided over any one of a top surface and a bottom surface of the base sheet; and a protective sheet provided on a surface of the elastic sheet opposite to the surface that is in contact with the base sheet and including second slits formed to correspond in position to the first slits of the base sheet.

10 Claims, 10 Drawing Sheets

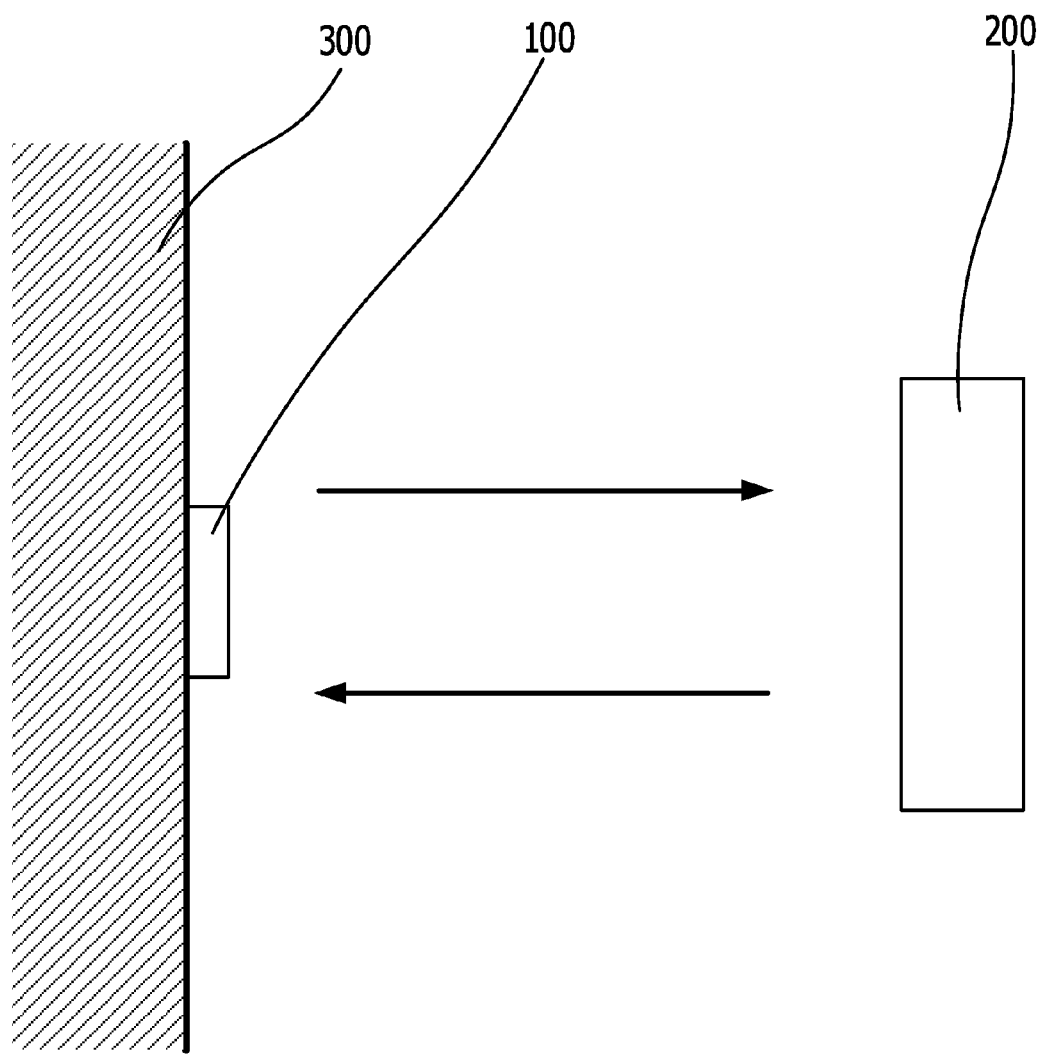

RFID TAG AND RFID SYSTEM

CROSS-REFERENCE TO RELATED APPLICATIONS

This application is based upon and claims the benefit of priority of the prior Japanese Patent Application No. 2012-162456 filed on Jul. 23, 2012, the entire contents of which are incorporated herein by reference.

FIELD

The embodiments discussed herein are related to an RFID (Radio Frequency IDentification) tag that exchanges information with an external device in a non-contact manner.

BACKGROUND

Recently, various RFID tags have been proposed exchanging information with an external device, represented by a reader/writer, in a non-contact manner through a radio wave.

As a kind of such RFID tags, there has been proposed an RFID tag configured such that an antenna pattern and a circuit chip for a radio communication are mounted on a base sheet made of plastic or paper. The RFID tag of this type may be attached to, for example, a product to exchange information on the product with an external device so as to perform, for example, an identification of the product.

In general, when such an RFID tag is attached to a surface of a product made of an easily deformable material such as, for example, rubber, the antenna pattern in the RFID tag may be broken because of the deformation in the RFID tag such as an elongation or a flexure caused by the deformation of the product material. Also, when the temperature around the product changes, the difference in linear expansion coefficient among the product itself, and the cladding and the base sheet of the RFID tag may produce stresses between the product and the RFID tag so that the antenna pattern in the RFID tag may be broken.

In addition, when the RFID tag is extended and attached to a product having a curved portion or a corner portion on a surface thereof, the difference in the radius of the curvature between the product itself, and the cladding and the base sheet of the RFID tag may produce tensile stresses between the product and the RFID tag so that the antenna pattern in the RFID tag may be broken.

The following is reference document:
[Document 1] Japanese Laid-open Patent Publication No. 2006-268090.

SUMMARY

According to an aspect of the embodiments, an RFID tag includes: a base sheet in which a plurality of first slits are formed to extend alternately from two opposite sides from an end of the base sheet; an antenna pattern provided on the base sheet by folding the antennal pattern to avoid the first slits; an RFID chip provided on the base sheet to be electrically connected to the antenna pattern; an elastic sheet provided on any one of a top surface and a bottom surface of the base sheet; and a protective sheet provided on a surface of the elastic sheet opposite to the surface that is in contact with the base sheet and including second slits formed to correspond in position to the first slits of the base sheet.

The objects and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 1 is a view illustrating a system using an RFID tag according to the present exemplary embodiment;

DESCRIPTION OF EMBODIMENTS

First, FIG. 1 illustrates an example of a system using an RFID tag according to the present exemplary embodiment.

An RFID tag 100 receives electromagnetic field energy emitted from a reader/writer 200 as electric power by an antenna pattern, and a circuit chip (RFID chip) in the RFID tag 100 is driven by the electric power to perform a communication operation. The reader/writer 200 reads data recorded in the RFID chip in the RFID tag 100 attached to a product 300. The read data are sent to an information device such as, for example, a computer connected to the reader/writer 200 to perform a product management. Also, the data may be sent to the reader/writer 200 from the information device such as, for example, a computer, and recorded in the RFID chip in the RFID tag 100.

Figure 2A:
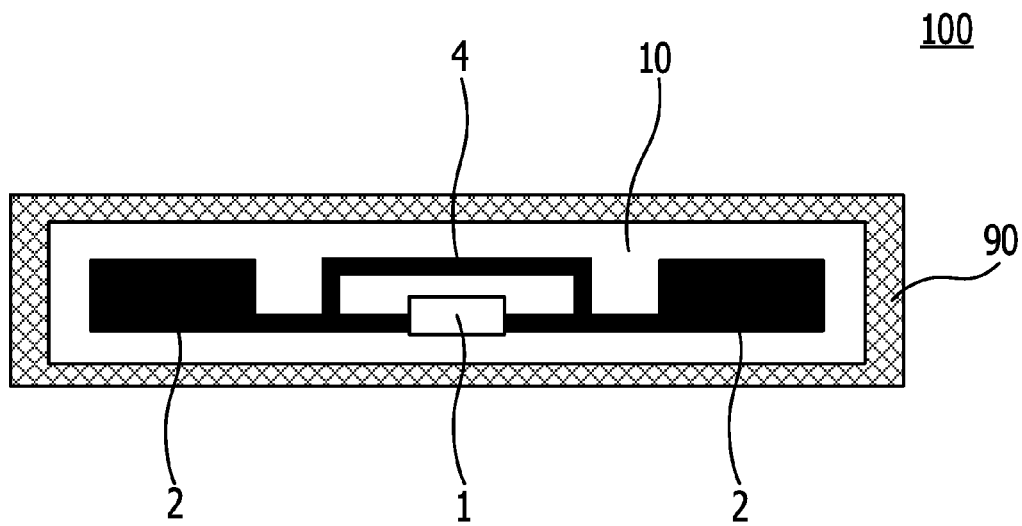
FIG. 2A and FIG. 2B are views illustrating the structure of a conventional RFID tag.

Subsequently, as a comparative example, an example of the structure of a conventional RFID tag 100 will be described with reference to FIGS. 2A and 2B. FIG. 2A illustrates a plan view of the conventional RFID tag 100 in a state where a cover sheet and a part of a protective cladding on the cover sheet are removed, and FIG. 2B illustrates the cross-sectional view of the conventional RFID tag 100.

The RFID tag 100 illustrated in FIG. 2A includes an antenna pattern 2 provided on a base sheet 10, a circuit chip 1 that is adhered to the base sheet 10 by an epoxy-based adhesive and electrically connected to the antenna pattern 2 via a bump (not illustrated), and an inductance pattern 4 that is electrically connected to the antenna pattern 2 to generate inductance.

Figure 2B:
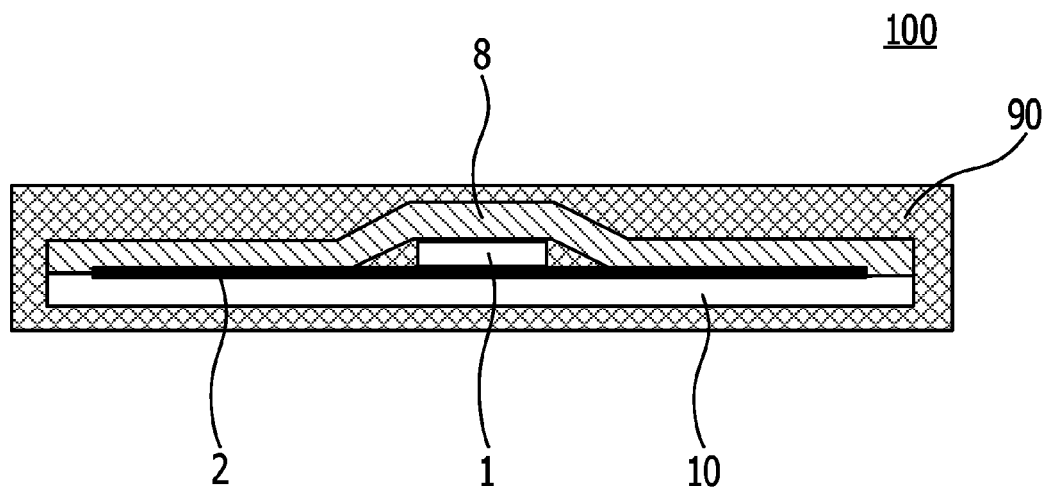

Referring to FIG. 2B, the RFID tag 100 includes a cover sheet 8 that is adhered to the base sheet 10 to cover the antenna pattern 2, the circuit chip 1, and the inductance pattern 4. The cover sheet 8 is typically made of a material selected from the group comprising, for example, a PET material, a polyester material, a polyolefin material, a polycarbonate material, and an acrylic based material. Also, the base sheet 10 and the cover sheet 8 are covered with a protective cladding 90 made of, for example, a resin.

Hereinafter, exemplary embodiments according to the technology of the present disclosure will be described in detail with reference to accompanying drawings.

Figure 3A:
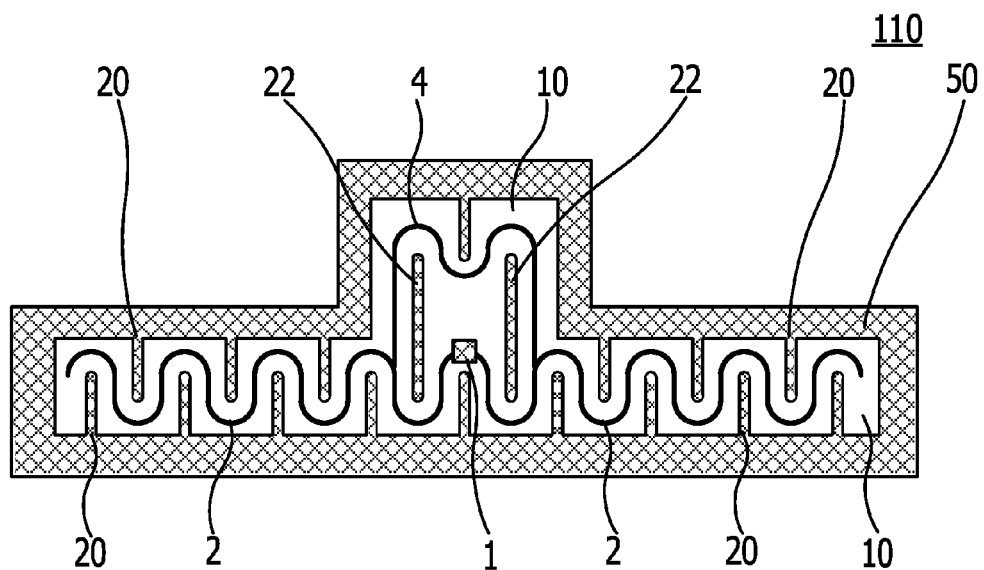
FIG. 3A and FIG. 3B are views illustrating the structure of an RFID tag according to a first exemplary embodiment.
Figure 3B:
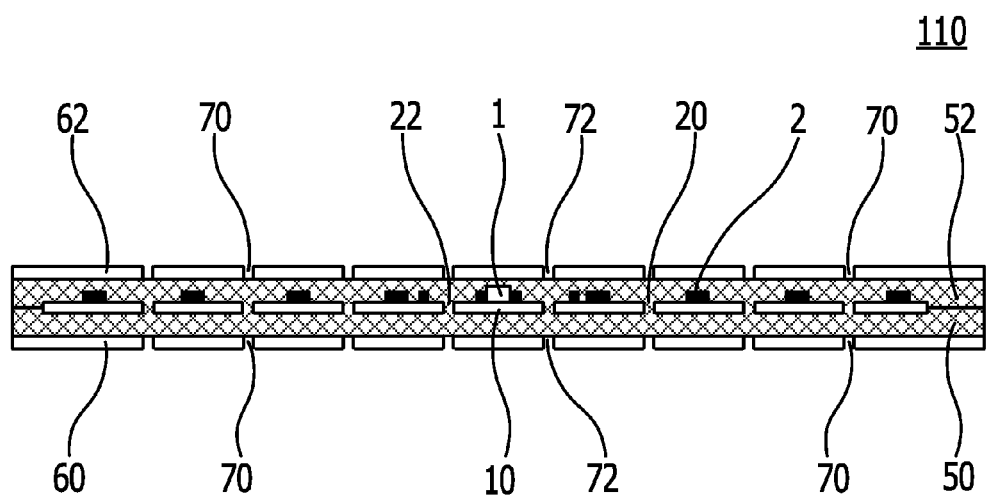

FIGS. 3A and 3B are view illustrating the structure of an RFID tag according to the first exemplary embodiment to which the disclosed technology is applied. FIG. 3A illustrates a plan view of an RFID tag 110 according to the first exemplary embodiment in a state where an upper rubber sheet and an upper reinforcement film are removed, and FIG. 3B illustrates a cross-sectional view of the RFID tag 110. The RFID tag 110 according to the first exemplary embodiment includes an antenna pattern 2 provided on a base sheet 10, a circuit chip 1 adhered to the base sheet 10 by an epoxy-based adhesive and electrically connected to the antenna pattern 2 via a bump (not illustrated), and an inductance pattern 4 that is electrically connected to the antenna pattern 2 to generate inductance.

In the RFID tag 110 according to the first exemplary embodiment, a plurality of slits 20 are formed to extend alternately from the top and the bottom sides of the base sheet 10 in the widthwise direction of the base sheet 10 (in the vertical direction in the drawing). The reason why the slits 20 are alternately formed is to suppress the strength of the base sheet 10 from being weakened when the widthwise length of the base sheet 10 is locally shortened.

The antenna pattern 2 is wired in such a manner that it is folded in a meandering shape to avoid the slits 20. Also, since the slits 20 are also formed from an end portion of the base sheet 10 in the portion where the inductance pattern 4 is wired, the inductance pattern 4 is also wired in such a manner that it is folded in a meandering shape to avoid the slits 20. Also, openings 22 are formed in the central portion of the base sheet 10 which is surrounded by the antenna pattern 2 and the inductance pattern 4.

Subsequently, referring to FIG. 3B, the base sheet 10 is sandwiched in a vertical direction between a lower rubber sheet 50 and an upper rubber sheet 52 which are made of an elastic body such as, for example, silicon rubber. The slits 20 and the openings 22 of the base sheet 10 are also occupied by the lower rubber sheet 50 and the upper rubber sheet 52. Also, the lower rubber sheet 50 and the upper rubber sheet 52 are sandwiched between a lower reinforcement film 60 and an upper reinforcement film 62 which are disposed on the bottom surface of the lower rubber sheets 50 and the top surface of the upper rubber sheet 52, respectively, and made of, for example, a PET material. Also, in the lower reinforcement film 60 and the upper reinforcement film 62, slits 70 and openings 72 are formed to correspond, in position, to the slits 20 and the openings 22 of the base sheet 10.

As described above, the plurality of alternate slits 20 and the openings 22 are formed in the base sheet 10. Thus, even if expansion and contraction stresses are applied to the base sheet 10 as the RFID tag 110 is expanded or contracted in the lengthwise direction (in the horizontal direction in the drawing), the widths of the slits 20 and the openings 22 are changed in response to the stresses and thus, stresses are not substantially applied to the antenna pattern 2 and the inductance pattern 4.

Also, since the lower rubber sheet 50 and the upper rubber sheet 52 disposed on the bottom surface and top surface of the base sheet 10, respectively, to sandwich the base sheet 10 therebetween are expanded or contracted in response to the lengthwise expansion or contraction of the base sheet 10, stresses are not substantially applied to the base sheet.

Also, since the plurality of alternate slits 70 and the openings 72 are formed in the lower reinforcement film 60 and the upper reinforcement film 62 disposed on the bottom surface of the lower rubber sheet 50 and the top surface of the upper rubber sheet 52, respectively, to sandwich the lower rubber sheet 50 and the upper rubber sheet therebetween, the widths of the slits 70 and the openings 72 are changed in response to the stresses even if the expansion and contraction stresses are applied to the lower reinforcement film 60 and the upper reinforcement film 62 as the RFID tag 110 is expanded and contracted lengthwise (in the horizontal direction in the drawing). Accordingly, stresses are not substantially applied to the lower rubber sheet 50 and the upper rubber sheet 52.

Thus, even if the RFID tag 110 is expanded or contracted lengthwise (in the horizontal direction in the drawing), the stresses are not substantially applied to the antenna pattern 2 and the inductance pattern 4. Thus, there is an effect that the antenna pattern 2 and the inductance pattern 4 are not broken easily.

Figure 4A:
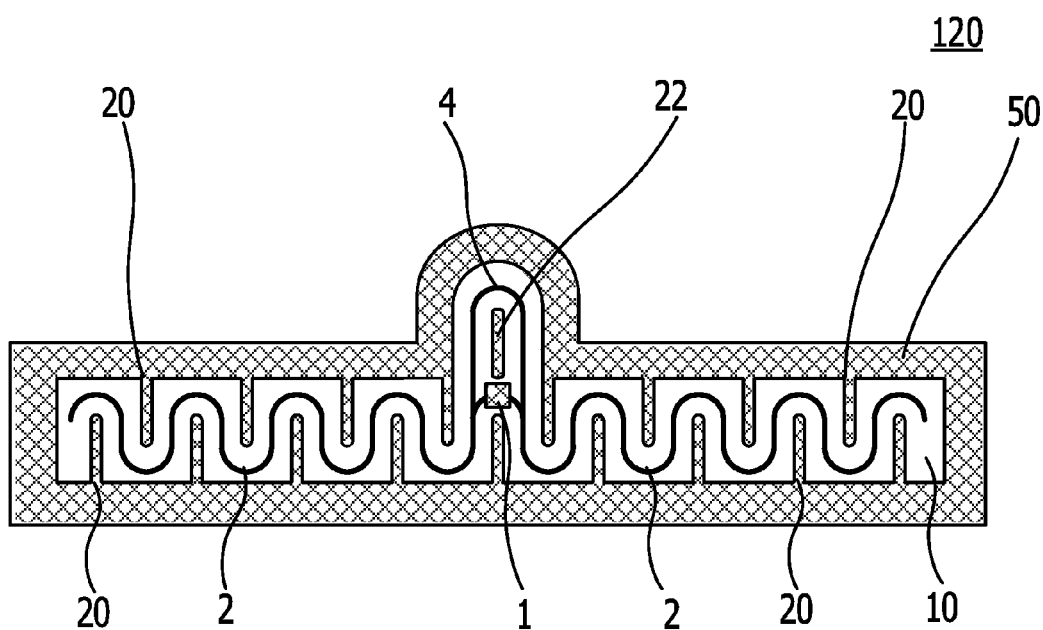
FIG. 4A and FIG. 4B are views illustrating the structure of an RFID tag according to a second exemplary embodiment.
Figure 4B:
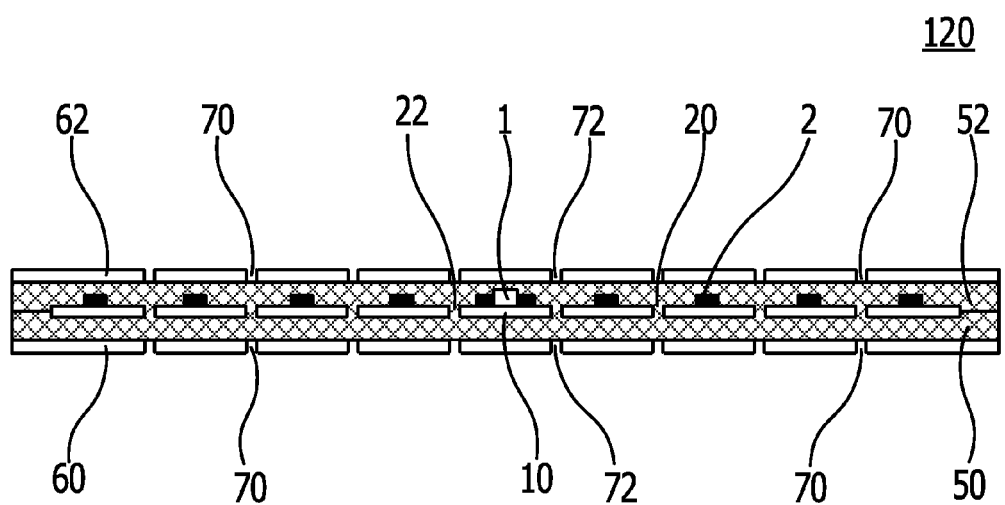

FIG. 4A illustrates a plan view of an RFID tag 120 according to a second exemplary embodiment in a state where an upper rubber sheet and an upper reinforcement sheet are removed, and FIG. 4B illustrates a cross-sectional view of the RFID tag 120. The RFID tag 120 of the second exemplary embodiment and the RFID tag 110 of the first exemplary embodiment are different from each other in terms of the shape of the inductance pattern 4.

A circuit chip 1 is connected to an antenna pattern 2 via a bump (not illustrated). Herein, since an adhesive (not illustrated) is filled in the connecting portion, a small capacitor that is unnecessary in design is formed between the circuit chip 1 and the antenna pattern 2. The parasitic capacitance of such a capacitor disturbs the input of power from the antenna pattern 2 to the circuit chip 1, which may cause a problem such as degradation of a communication range of the RFID tag.

Accordingly, an inductance pattern 4 is provided to generate inductance so that the inductance and the parasitic capacitance generate resonance to counterbalance the parasitic capacitance. Since the parasitic capacitance changes depending on the relative position relationship between the circuit chip 1 and the antenna pattern 2, it is required to change the shape of the inductance pattern 4 that generates the resonance.

Subsequently, referring to FIGS. 5A to 5D, descriptions will be made as to modified examples in which the folded shape of the antenna pattern 2 in which the slits 20 formed in the base sheet 10 vary in shape.

The slits 20 may be formed alternately from left and right with respect to the longitudinal direction of the base sheet 10 (in the vertical direction in the drawing), and the shape, width, and interval of the slits 20 may be variously modified. Also, the antenna pattern 2 and the inductance pattern 4 may be variously changed in shape and may be wired to avoid the slits 20.

Figure 5A:
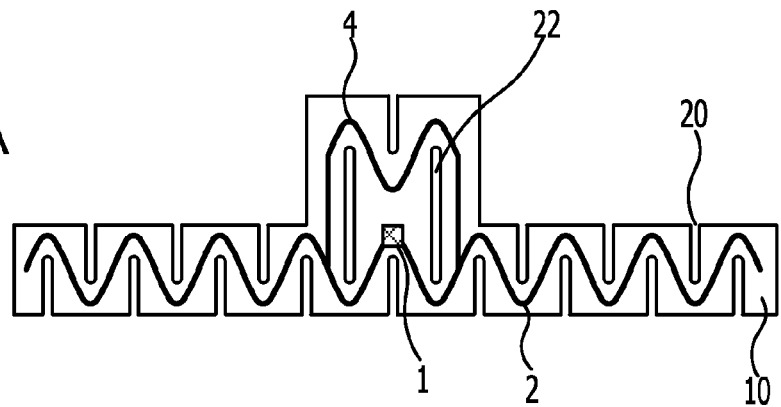
FIGS. 5A to 5D are views illustrating modified examples of an antenna pattern and slits.

FIG. 5A illustrates a modified example in which the folded shape of the antenna pattern 2 takes a sine wave shape. The shape and interval of the slits 20 are the same as those in the above described RFID tag 110 of the first exemplary embodiment.

Figure 5B:
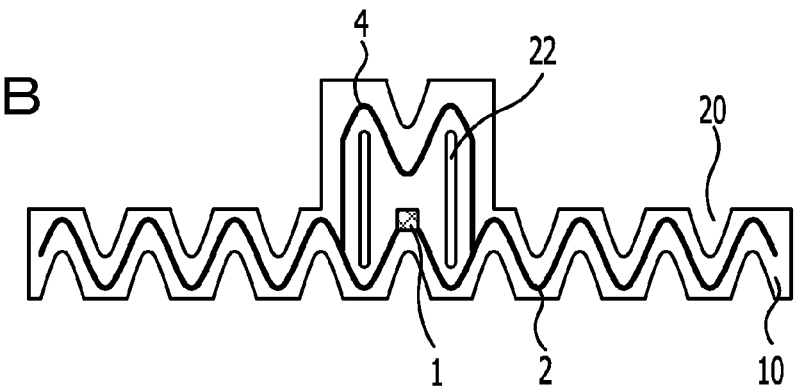

FIG. 5B illustrates a modified example in which the slits 20 take a wedge (triangular) shape, and the folded antenna pattern 2 takes a sine wave shape. Here, the end side of each of the slits 20 is largely opened to be capable of coping with torsion as well as the bending in the longitudinal direction.

Figure 5C:
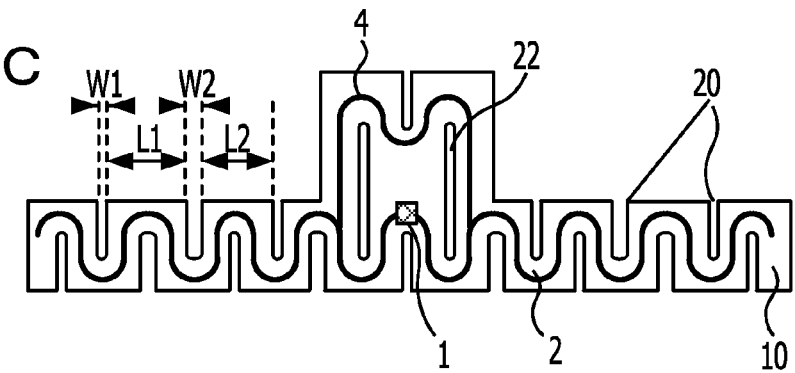

FIG. 5C illustrates a modified example in which the width and interval of the slits 20 vary. As to the slit width, W1 and W2 coexist in which W2 is wider than W1. Also, as to the interval of the slits 20, L1 and L2 coexist in which L2 is narrower than L1.

Figure 5D:
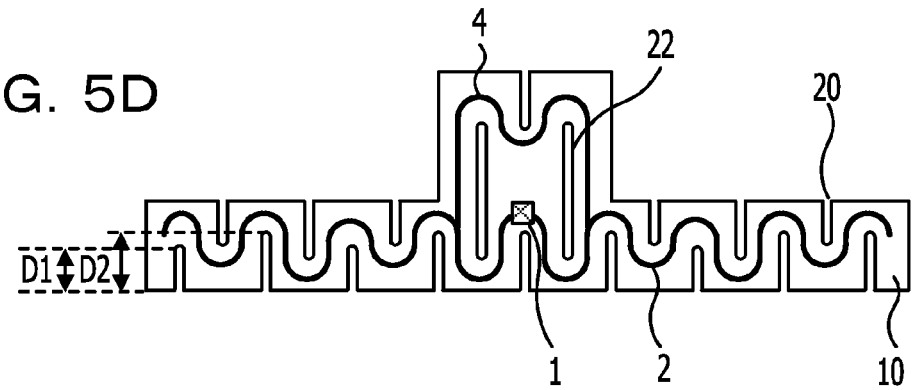

FIG. 5D illustrates a modified example in which the cut depths of the slits 20 vary, and the folded widths of the antenna pattern 2 vary according to the cut depths. As to the cut depths of the slits, D1 and D2 coexist in which D2 is deeper than D1. Also, the folded width (in the vertical direction in the drawing) of the antenna pattern 2 varies according to the cut depth of the slits 20.

Hereinafter, a method of manufacturing the RFID tag according to the present exemplary embodiment will be described with reference to FIGS. 6A, 6B, 7 and 8.

Figure 6A:
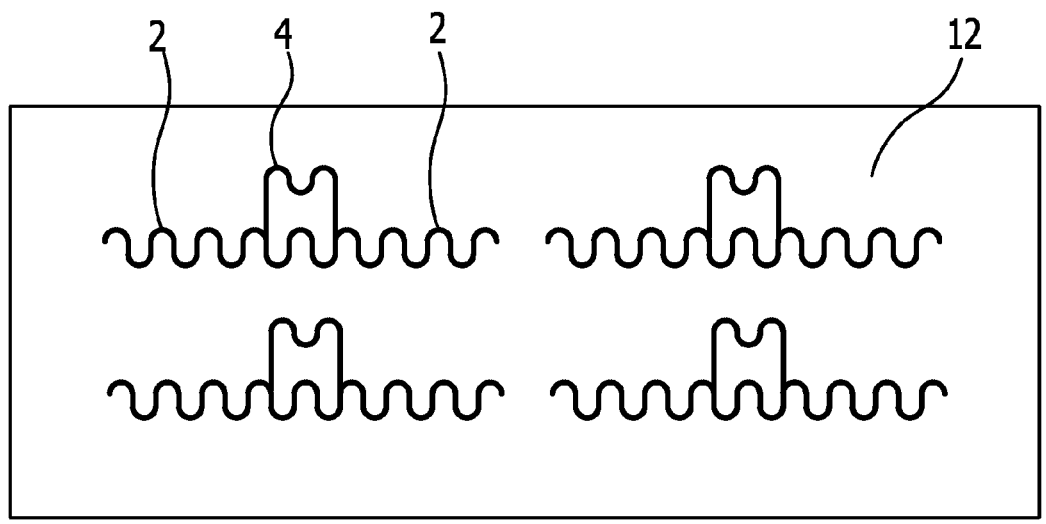
FIGS. 6A and 6B are views illustrating the steps of forming an antenna pattern and an inductance pattern, and the steps of cutting openings and a base sheet using a laser in a method of manufacturing an RFID tag according to the first exemplary embodiment.

First, referring to FIG. 6A, a mask is disposed on a PET sheet 12, and the PET sheet 12 is screen-printed using an Ag paste, and then the mask is removed. Subsequently, an antenna pattern 2 and an inductance pattern 4 which are made of the Ag paste are formed.

Figure 6B:
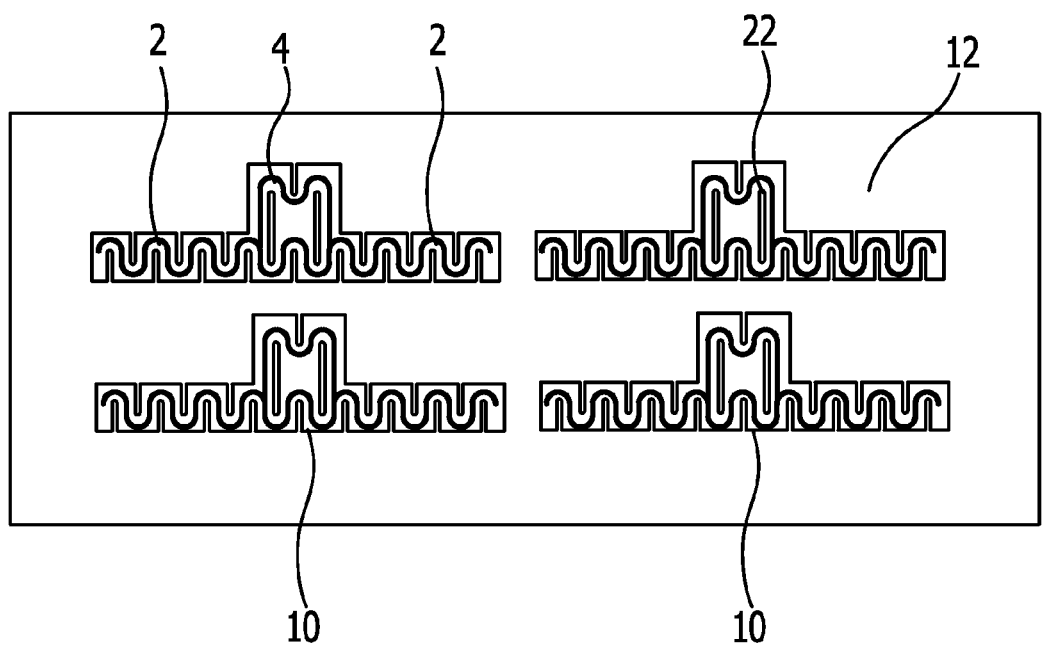

Then, referring to FIG. 6B, the PET sheet 12 is cut by a laser in the portion surrounded by the antenna pattern 2 and the inductance pattern 4 to form openings 22. Then, the PET sheet 12 is cut by the laser in the vicinity of the antenna pattern 2 and the inductance pattern 4 to obtain a base sheet 10.

Then, a circuit chip 1 is fixedly bonded to the antenna pattern 2 by, for example, soldering with a bump interposed therebetween. Also, the vicinity of the circuit chip 1 is reinforced by curing an epoxy-based adhesive.

Figure 7:
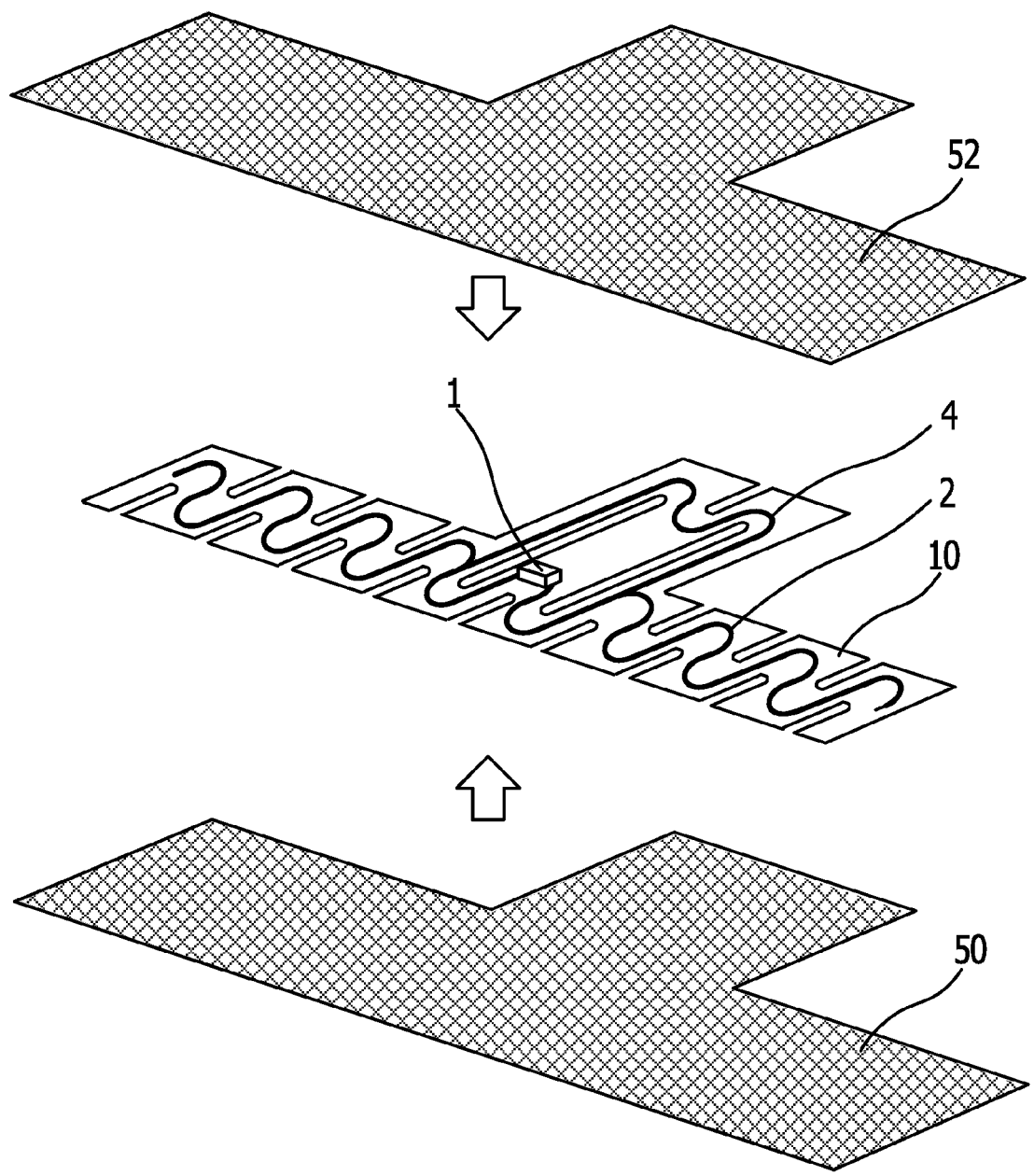
FIG. 7 is a view illustrating the steps of adhering a lower rubber sheet and an upper rubber sheet to the base sheet in the method of manufacturing the RFID tag according to the first exemplary embodiment.

Then, referring to FIG. 7, a lower rubber sheet 50 and an upper rubber sheet 52 are adhered to the bottom and top surfaces of the base sheet 10.

Figure 8:
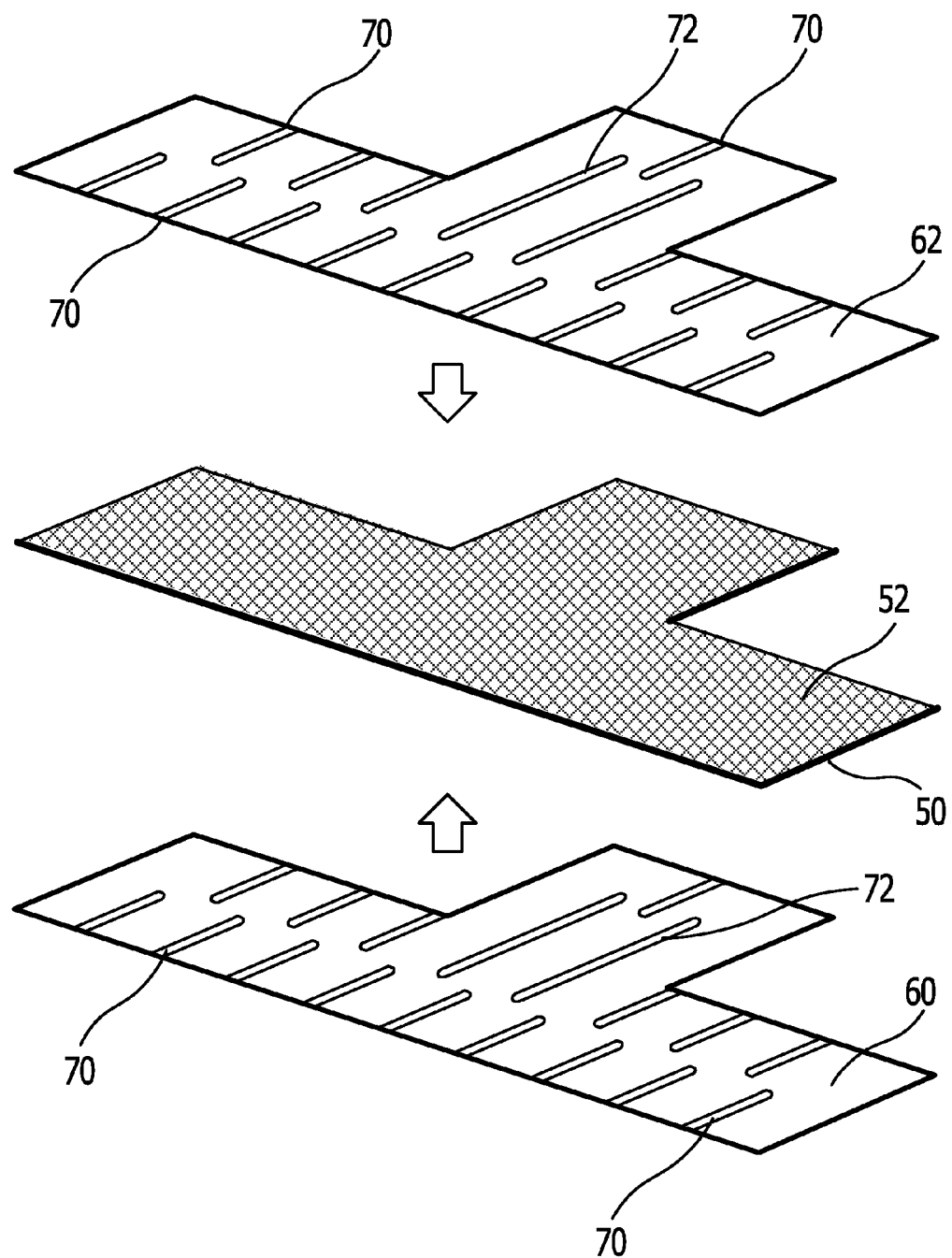
FIG. 8 is a view illustrating the steps of adhering a lower reinforcement film and an upper reinforcement film to a bottom side of the lower rubber sheet and a top side of the upper rubber sheet, respectively, in the method of manufacturing the RFID tag according to the first exemplary embodiment.

Subsequently, referring to FIG. 8, a lower reinforcement film 60 and an upper reinforcement film 62 are prepared in which slits 70 and openings 72 are formed in advance and then adhered to the bottom surface of the lower rubber sheet 50 and the top surface of the upper rubber sheet 52, respectively.

Finally, referring to FIGS. 9A to 9C and 10A and 10B, examples will be described in which a RFID tag 110, 120 according to the first and second exemplary embodiments of the present disclosure is mounted on a product 300. Although the RFID tag 110 is exemplified in the following description, the RFID tag 120 may be mounted in the same manner.

In a case where the surface of the product 300 is flat, an adhesive sheet may be adhered to one of the lower reinforcement film 60 and the upper reinforcement film 62 in the outside of the RFID tag 110, and then may be attached to the product 300. However, in a case where the surface of the product 300 is curved and thus, it is difficult to attach the RFID tag 110 by the adhesive sheet, a band 80 as illustrated in FIGS. 9A to 9C may be used to fix the RFID tag 110 on the product 300.

Figure 9A:
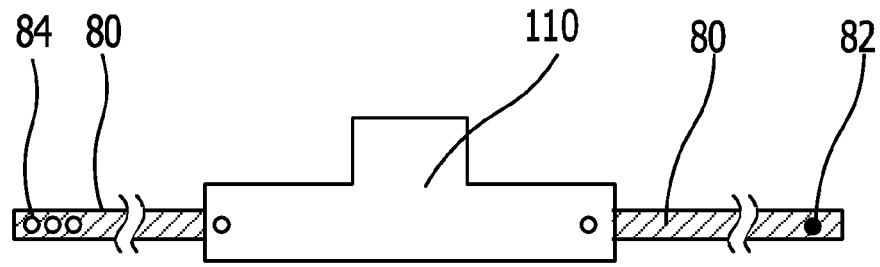
FIGS. 9A to 9C are views illustrating an example where the RFID tag according to the first exemplary embodiment is mounted on a product.

FIG. 9A illustrates an example where the RFID tag 110 of the first exemplary embodiment is attached on the band 80. At one end of the band 80 (left side in the drawing), a plurality of buttons 84 are attached, and at the other end of the band (right side in the drawing), a button 82 to be fitted into one of the buttons 84 is attached.

Figure 9B:
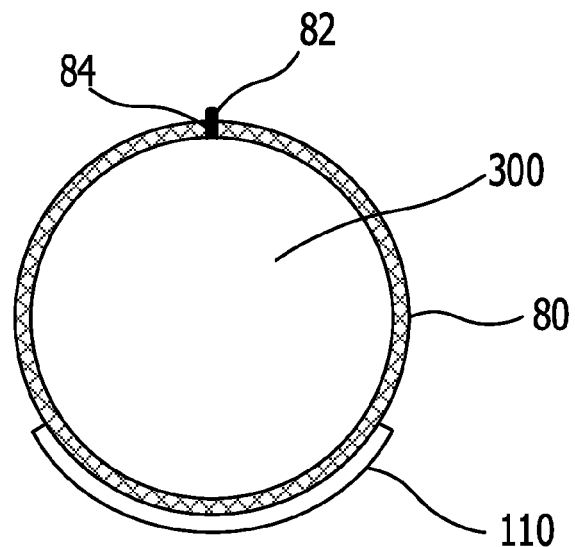
Figure 9C:
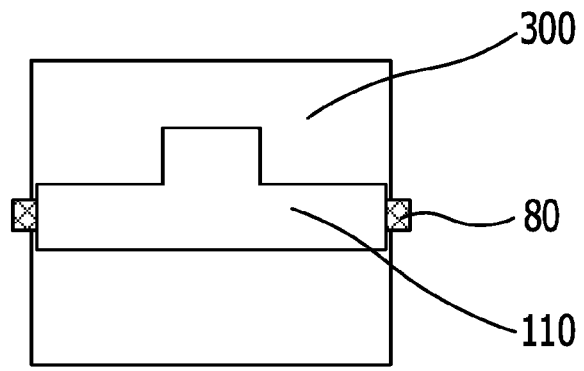

FIG. 9B is a top plan view illustrating a state where the RFID tag 110 is attached on the cylindrical product 300 using the band 80. FIG. 9C is a side view illustrating the state where the RFID tag 110 is attached on the cylindrical product 300 by using the band 80.

The band 80 is wound to surround the circumference of the cylindrical product 300, and then at the ends of the band 80, the button 82 is fitted into one of the plurality of buttons 84 in accordance with the circumferential length of the product 300 so as to fix the band 80 on the product 300.

Figure 10A:
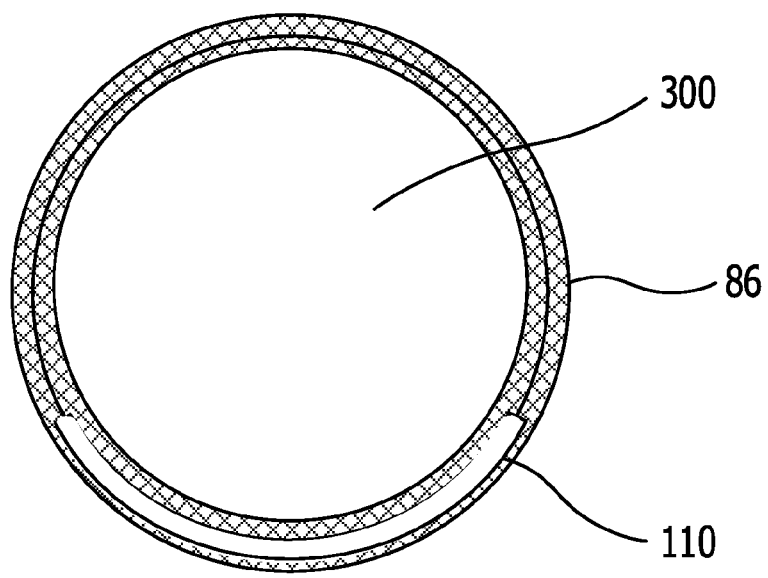
FIGS. 10A and 10B are views illustrating an example where the RFID tag according to the first exemplary embodiment is mounted on a product.
Figure 10B:
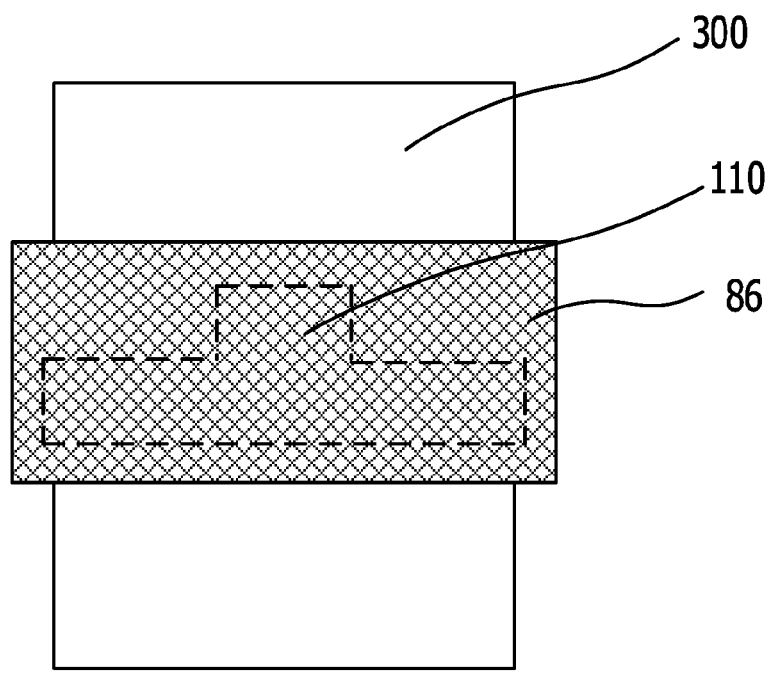

FIGS. 10A and 10B illustrate an example where the RFID tag 110 of the first exemplary embodiment is embedded in an elastic body such as, for example, rubber, which in turn is formed in a ring-shaped band 86. FIG. 10A is a top plan view illustrating a state where the band 86 embedded with the RFID tag 110 is attached to the cylindrical product 300. FIG. 10B is a side view illustrating the state where the ring-shaped band 86 is attached to the cylindrical product 300. Since the contractible RFID tag 110 is embedded in the elastic body, the whole band 86 has contractibility. Accordingly, the RFID tag 110 may be attached even on various products 300 having different circumferential lengths using the contractible band 86.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An Radio Frequency Identification (RFID) tag comprising:
    a base sheet in which a plurality of first slits are formed to extend alternately from two opposite sides from an end of the base sheet;
    an antenna pattern provided on the base sheet by folding the antenna pattern to avoid the first slits;
    an RFID chip provided over the base sheet and electrically connected to the antenna pattern;
    an elastic sheet provided over any one of a top surface and a bottom surface of the base sheet; and
    a protective sheet provided on a surface of the elastic sheet opposite to the surface that is in contact with the base sheet and including second slits formed to correspond in position to the first slits of the base sheet.

2. The RFID tag according to claim 1, further comprising an inductance pattern provided on the base sheet to be electrically connected to the antenna pattern,
    wherein the base sheet is formed with a first opening in thea portion surrounded by the antenna pattern and the inductance pattern.

3. The RFID tag according to claim 2, wherein the protective sheet is formed with a second opening that corresponds in position to the first opening of the base sheet.

4. The RFID tag according to claim 1, wherein the antenna pattern is folded in a circular arc shape.

5. The RFID tag according to claim 1, wherein the antenna pattern is folded in a sine wave shape.

6. The RFID tag according to claim 1, wherein the first slits include a slit having a first width, and a slit having a second width wider than the first width.

7. The RFID tag according to claim 1, wherein
the first slits include, from the end of the base sheet, a slit having a first cut depth and a slit having a second cut depth which is deeper than the first cut depth.

8. The RFID tag according to claim 1, wherein
among the first slits, an interval between one first slit and another first slit adjacent thereto is either a first interval or a second interval which is wider than the first interval.

9. The RFID tag according to claim 1, wherein
the antenna pattern is made of a silver (Ag) paste.

10. An Radio Frequency Identification (RFID) system comprising:
  an RFID tag including:
  a base sheet in which a plurality of first slits are formed to extend alternately from two opposite sides from an end of the base sheet;
  an antenna pattern provided on the base sheet by folding the antenna pattern to avoid the first slits;
  an RFID chip provided over the base sheet and electrically connected to the antenna pattern;
  elastic sheets respectively provided over top and bottom surfaces of the base sheet; and
  protective sheets provided on top and bottom surfaces of the elastic sheets and including second slits formed to correspond in position to the first slits of the base sheet; and
  a reader/writer configured to read data recorded in the RFID chip and/or record data in the RFID chip.

* * * * *